(12) United States Patent
Sudo

(10) Patent No.: US 8,790,979 B2
(45) Date of Patent: Jul. 29, 2014

(54) SEMICONDUCTOR DEVICE AND METHOD FOR MANUFACTURING SAME

(71) Applicant: Kabushiki Kaisha Toshiba, Tokyo (JP)

(72) Inventor: Gaku Sudo, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/762,955

(22) Filed: Feb. 8, 2013

(65) Prior Publication Data

US 2014/0008706 A1 Jan. 9, 2014

(30) Foreign Application Priority Data

Jul. 6, 2012 (JP) ................................. 2012-152915

(51) Int. Cl.
*H01L 21/336* (2006.01)

(52) U.S. Cl.
USPC ........... 438/283; 438/151; 438/157; 438/424; 438/479; 438/738; 257/329; 257/347; 257/E21.409; 257/E21.41; 257/E21.623; 257/E21.637

(58) Field of Classification Search
CPC ............ H01L 29/66795; H01L 29/785; H01L 29/1037; H01L 29/41791; H01L 21/845; H01L 21/823821; H01L 21/823431; H01L 21/76229; H01L 27/10826; H01L 27/10879; H01L 27/1211; H01L 27/0886
USPC ................. 438/151, 157, 283, 424, 479, 738; 257/329, 347, E21.409, E21.41, 257/E21.623, E21.637
See application file for complete search history.

(56) References Cited

U.S. PATENT DOCUMENTS

| 7,214,576 | B1 * | 5/2007 | Kaneko et al. | 438/197 |
|---|---|---|---|---|
| 7,915,108 | B2 | 3/2011 | Jang et al. | |
| 8,174,073 | B2 * | 5/2012 | Lee et al. | 257/347 |
| 8,637,371 | B2 * | 1/2014 | Chang et al. | 438/283 |
| 2009/0072276 | A1 * | 3/2009 | Inaba | 257/255 |
| 2009/0101977 | A1 | 4/2009 | Iwamatsu et al. | |
| 2009/0200604 | A1 * | 8/2009 | Chidambarrao et al. | 257/329 |
| 2010/0197099 | A1 * | 8/2010 | Kim et al. | 438/299 |
| 2011/0068405 | A1 * | 3/2011 | Yuan et al. | 257/365 |
| 2011/0284969 | A1 | 11/2011 | Wu | |
| 2012/0309157 | A1 | 12/2012 | Iwamatsu et al. | |
| 2013/0023102 | A1 * | 1/2013 | Aoyama et al. | 438/301 |
| 2013/0043563 | A1 * | 2/2013 | Nakazawa | 257/607 |

(Continued)

FOREIGN PATENT DOCUMENTS

| JP | 2008-091905 A | 4/2008 |
|---|---|---|
| JP | 2009-105122 A | 5/2009 |
| JP | 2011-243802 A | 12/2011 |

*Primary Examiner* — Bac Au
(74) *Attorney, Agent, or Firm* — Holtz Holtz Goodman & Chick PC

(57) ABSTRACT

According to one embodiment, a method for manufacturing a semiconductor device includes forming a fin in an upper surface of a semiconductor substrate to extend in a first direction, forming a mask film, making a plurality of first trenches in the mask film to extend in a second direction to reach the fin, filling sidewall members into the first trenches, making a second trench by removing the mask film from a portion of a space between the sidewall members, forming a gate insulating film and a gate electrode on a surface of a first portion of the fin disposed inside the second trench, making a third trench by removing the mask film from the remaining space between the sidewall members, and causing a second portion of the fin disposed inside the third trench to become a conductor.

16 Claims, 19 Drawing Sheets

(56) References Cited

U.S. PATENT DOCUMENTS

2013/0065371 A1* 3/2013 Wei et al. ............... 438/294
2013/0075797 A1* 3/2013 Okano ..................... 257/288
2014/0035043 A1* 2/2014 Lee et al. ................ 257/365

* cited by examiner

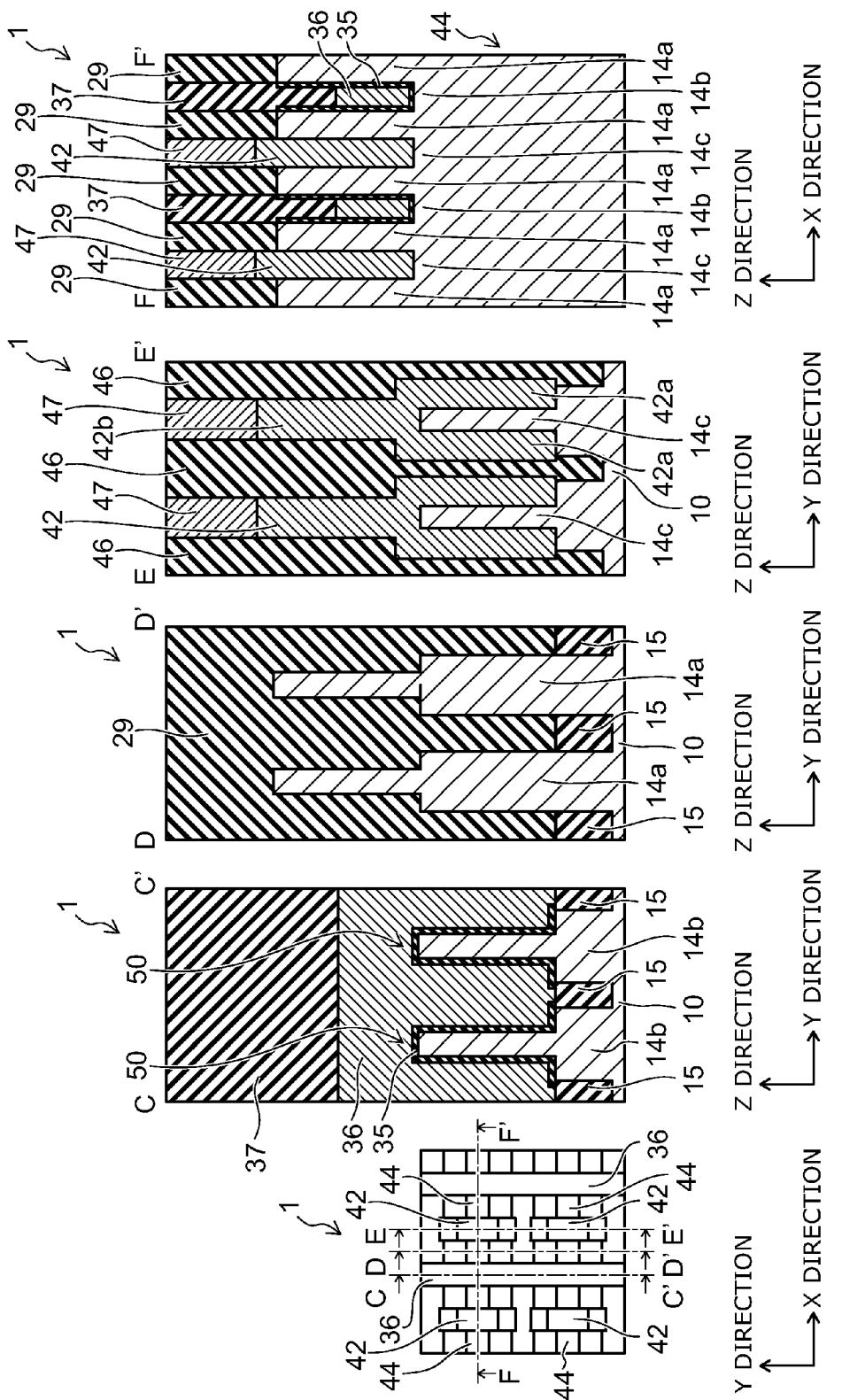

SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2012-152915, filed on Jul. 6, 2012; the entire contents of which are incorporated herein by reference.

FIELD

Embodiments described herein relate generally to a semiconductor device and a method for manufacturing the same.

BACKGROUND

In recent years, transistors that are compact and allow a large current to flow have become necessary as the integration of semiconductor devices increases. A fin transistor (a fin-FET) in which the upper surface of a semiconductor substrate is patterned into a fin configuration and a gate electrode is provided to straddle the fin has been proposed as such a transistor. In such fin transistors, the amount of current per chip surface area is large because the proportion of the channel width to the chip surface area is large. However, an even larger current is necessary for such fin transistors.

BRIEF DESCRIPTION OF THE DRAWINGS

FIG. 1A to FIG. 5B show a method for manufacturing a semiconductor device according to an embodiment;

FIG. 6A to FIG. 18C show the method for manufacturing the semiconductor device according to the embodiment; and FIGS. 19A to 19E show the semiconductor device according to the embodiment.

DETAILED DESCRIPTION

Figures 1A, 1B:
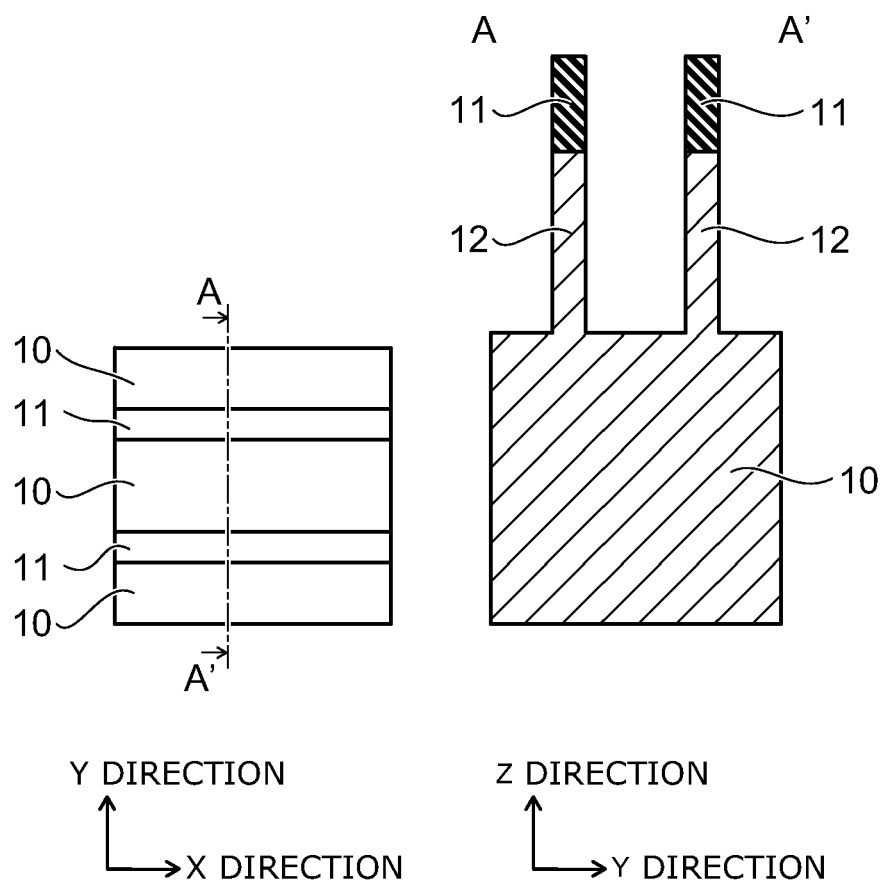

In general, according to one embodiment, a method for manufacturing a semiconductor device includes forming a fin in an upper surface of a semiconductor substrate to extend in a first direction, forming a mask film to cover the fin, making a plurality of first trenches in the mask film to extend in a second direction intersecting the first direction to reach the fin. The method includes filling sidewall members into the first trenches. The sidewall members are insulative. The method includes making a second trench by removing the mask film from a portion of a space between the sidewall members, forming a gate insulating film on a surface of a first portion of the fin disposed inside the second trench, forming a gate electrode on the gate insulating film inside the second trench to extend in the second direction to straddle the first portion, making a third trench by removing the mask film from the remaining space between the sidewall members, and causing a second portion of the fin disposed inside the third trench to become a conductor.

In general, according to one embodiment, a method for manufacturing a semiconductor device includes forming a fin in an upper surface of a semiconductor substrate to extend in a first direction. A cross section of the fin has an inverted T-shaped configuration. An upper portion of the fin is finer than a lower portion of the fin. The method includes removing the upper portion and two side portions of the lower portion of a first portion of the fin, forming a gate insulating film on a surface of the first portion, forming a gate electrode on the gate insulating film to extend in a second direction intersecting the first direction to straddle the first portion, and causing the upper portion and the two side portions of the lower portion of a second portion of the fin separated from the first portion in the first direction to become conductors.

In general, according to one embodiment, a semiconductor device includes a semiconductor substrate, a fin being formed in an upper surface of the semiconductor substrate to extend in a first direction, a gate electrode extending in a second direction intersecting the first direction to straddle a first portion of the fin, a gate insulating film disposed between the first portion and the gate electrode, and a conductive layer covering a second portion of the fin separated from the first portion in the first direction. The conductive layer includes a base portion disposed on a side surface of the second portion, and a protruding portion disposed in a region directly above the second portion to protrude upward from the base portion. A width of the protruding portion is finer than a width of the base portion in a cross section perpendicular to the first direction. An upper end of the first portion of the fin and an upper end of the second portion of the fin are positioned lower than an upper end of a portion of the fin excluding the first portion and the second portion.

An embodiment of the invention will now be described with reference to the drawings.

FIG. 1A to FIG. 5B show a method for manufacturing a semiconductor device according to the embodiment. In each of the drawings, drawing A is a plan view; and drawing B is a cross-sectional view along A-A' of drawing A.

FIG. 6A to FIG. 18C show the method for manufacturing the semiconductor device according to the embodiment. In each of the drawings, drawing A is a plan view; drawing B is a cross-sectional view along A-A' of drawing A; and drawing C is a cross-sectional view along line B-B' of drawing A.

Each of the drawings shows only a portion of the semiconductor device.

An XYZ orthogonal coordinate system is employed for convenience of description in the specification.

First, as shown in FIGS. 1A and 1B, a silicon substrate 10 is prepared. A direction perpendicular to the upper surface of the silicon substrate 10 is taken as a Z direction. Multiple hard masks 11 are formed on the silicon substrate 10 to extend in the X direction. The hard masks 11 are formed of, for example, silicon nitride and are disposed at uniform spacing along the Y direction. Then, the silicon substrate 10 is selectively removed by performing anisotropic etching such as RIE (reactive ion etching), etc., using the hard masks 11 as a mask. Thereby, multiple fins 12 are formed in the upper layer portion of the silicon substrate 10 to extend in the X direction.

Figures 2A, 2B:
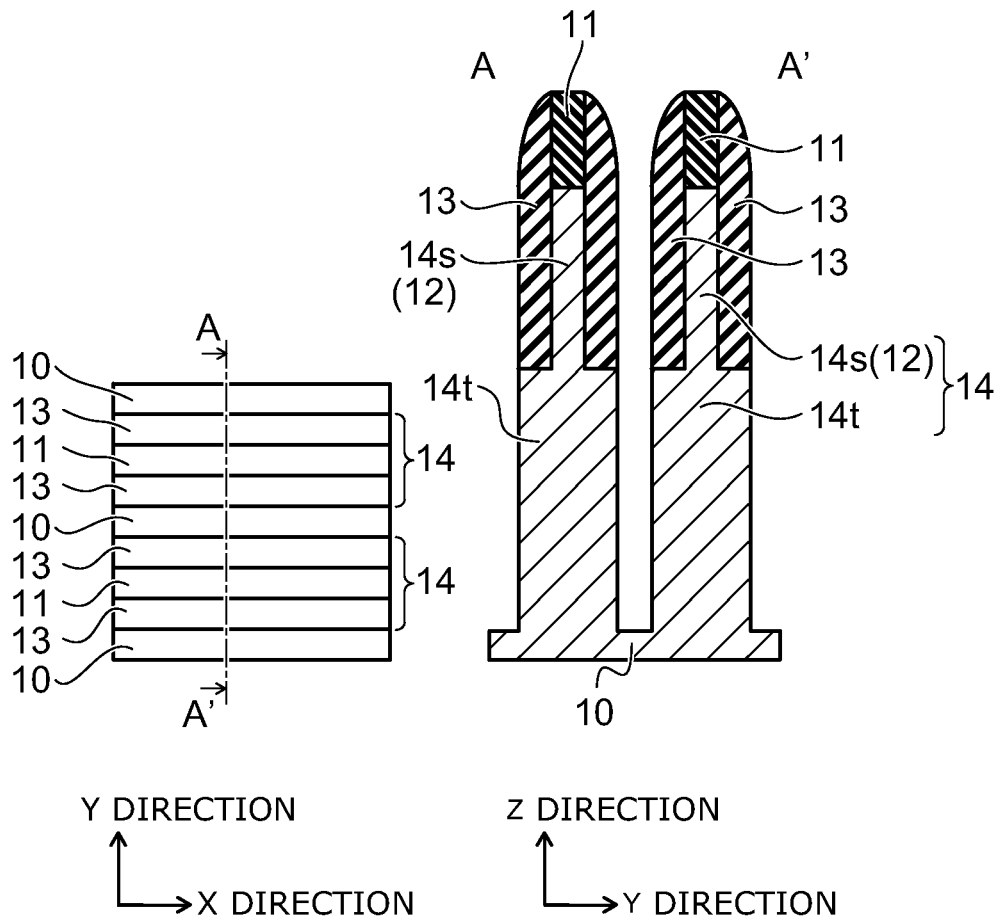

Then, as shown in FIGS. 2A and 2B, sidewall hard masks 13 made of silicon nitride are formed on the fins 12 and the side surfaces of the hard masks 11 by, for example, forming a silicon nitride film on the entire surface and performing etch-back of the entire surface. Continuing, the silicon substrate 10 is selectively removed by performing anisotropic etching using the hard masks 11 and the sidewall hard masks 13 as a mask. Thereby, multiple fins 14 are formed in the upper layer portion of the silicon substrate 10 to extend in the X direction, where the cross section of the fin 14 perpendicular to the longitudinal direction (the X direction) of the fin 14 has an inverted T-shaped configuration. An upper portion 14s of the fin 14 is the portion that was the fin 12; and the upper portion 14s of the fin 14 is finer than a lower portion 14t of the fin 14. In other words, the configuration of the fin 14 is a two-stage configuration in which the diametrical size changes discontinuously between the upper portion 14s and the lower portion 14t."

Figures 3A, 3B:
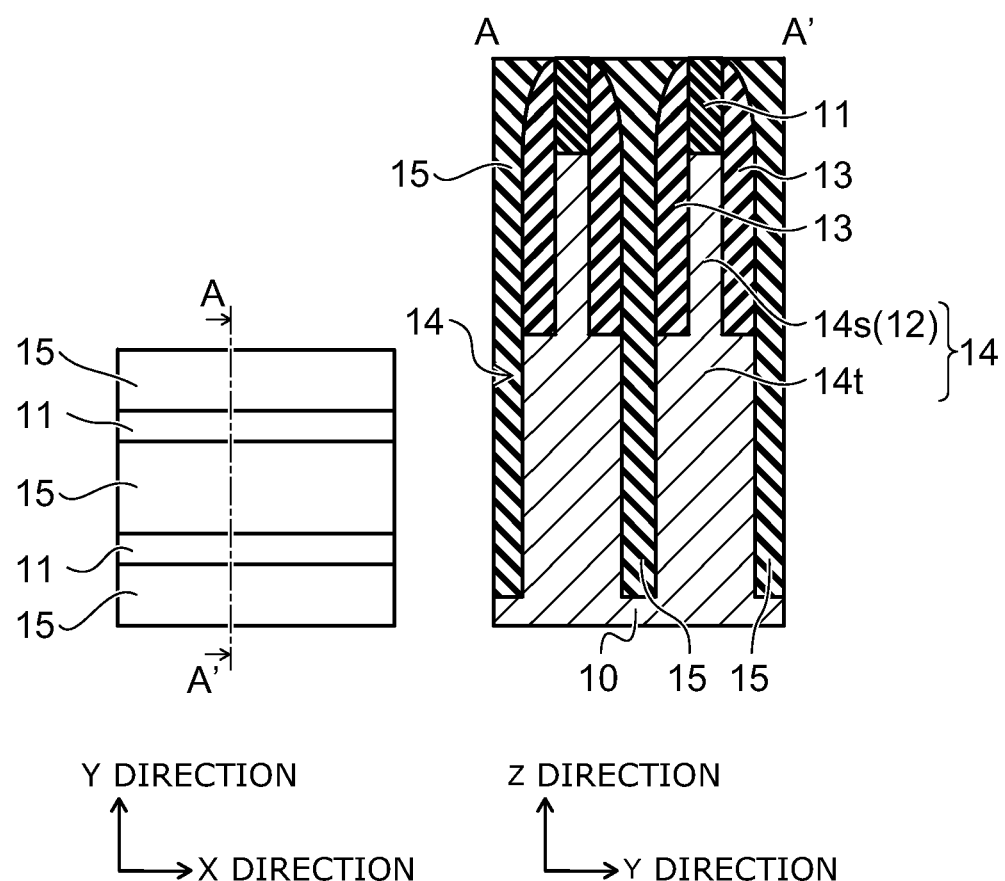

Continuing as shown in FIGS. 3A and 3B, an element-separating insulating film 15 is formed on the entire surface. The element-separating insulating film 15 is formed by, for example, coating silicon oxide. Then, the hard masks 11 are exposed by planarizing by performing CMP (chemical mechanical polishing) of the upper surface of the element-separating insulating film 15.

Figures 4A, 4B:
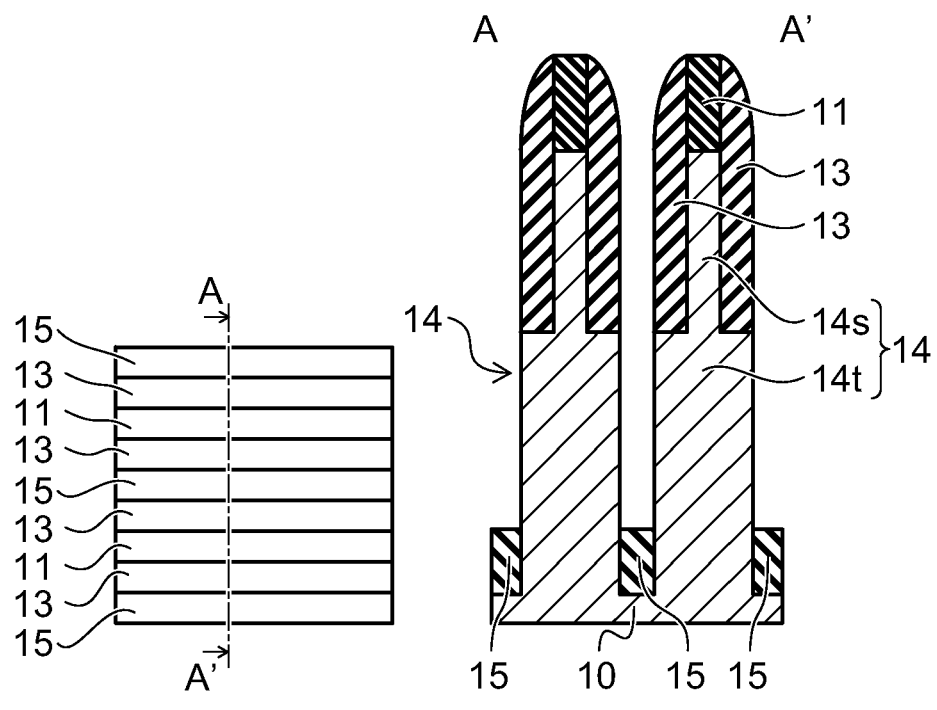

Then, as shown in FIGS. 4A and 4B, the element-separating insulating film 15 is recessed by performing, for example, wet etching. Thereby, the upper surface of the element-separating insulating film 15 is caused to recede; and only the lower end portions of the fins 14 are buried in the element-separating insulating film 15. Then, a punch-through stopper layer (not shown) is formed in the bottom portions of the fins 14 by performing ion implantation of an impurity.

Figures 5A, 5B:
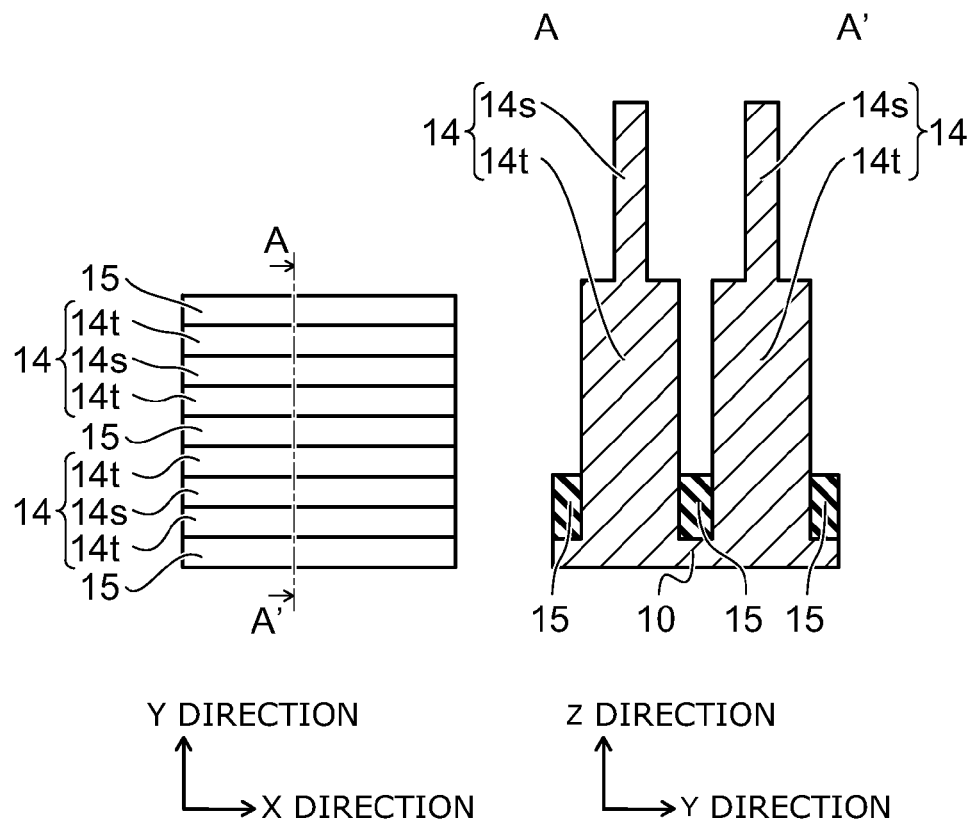

Continuing as shown in FIGS. 5A and 5B, the hard masks 11 and the sidewall hard masks 13 (referring to FIGS. 4A and 4B) are removed using phosphoric acid. Thereby, the portions of the fins 14 excluding the lower end portions of the fins 14 are exposed. In other words, the entire upper portions 14s of the fins 14 are exposed; and at least half of the upper sides of the lower portions 14t of the fins 14 also are exposed. On the other hand, the lower end portions of the fins 14 remain buried in the element-separating insulating film 15.

Figures 6A, 6B, 6C:
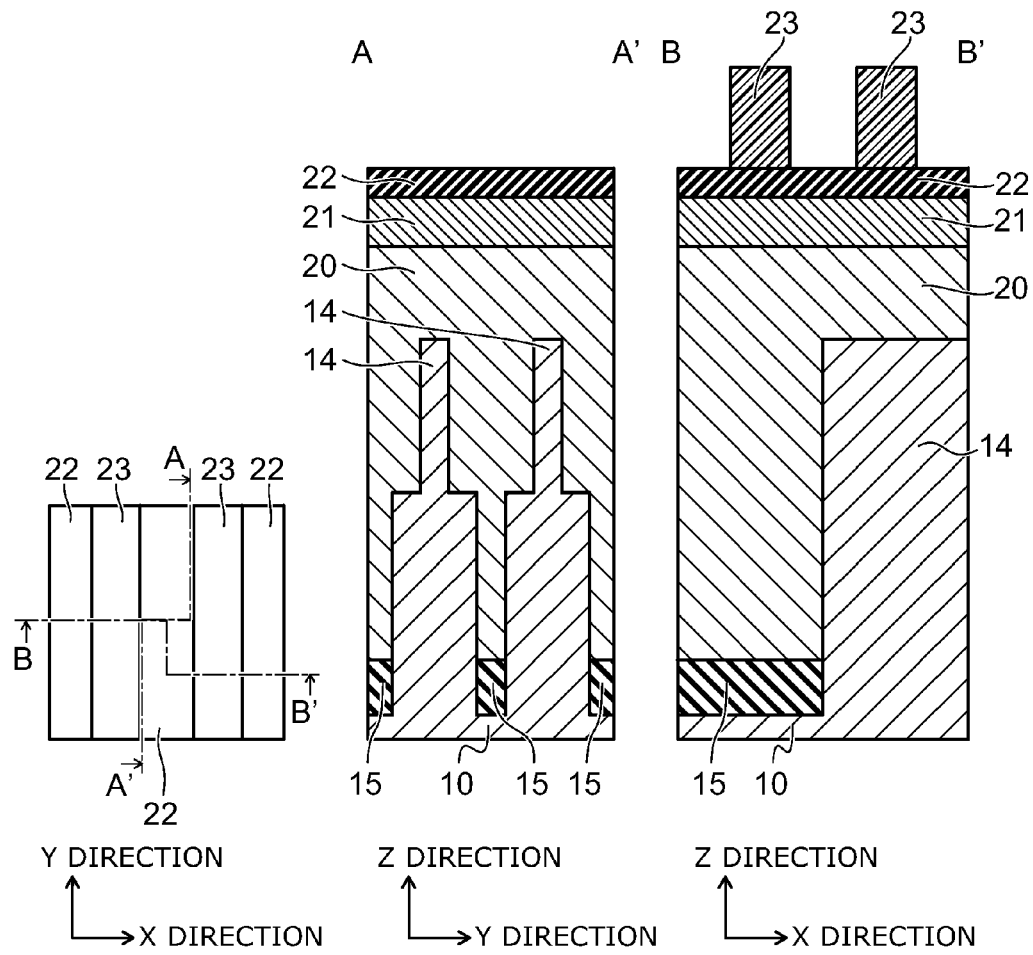

Then, as shown in FIGS. 6A to 6C, a carbon film 20 is formed as a mask film on the entire surface to cover the fins 14 by, for example, coating. The carbon film 20 may be formed by CVD (chemical vapor deposition); and the upper surface may be planarized by CMP after the film formation. Then, a non-doped silicon film 21 made of non-doped amorphous silicon is formed on the carbon film 20; and an anti-reflection coating (ARC) 22 is formed on the non-doped silicon film 21. Then, multiple resist patterns 23 extending in a direction (the Y direction) that intersects, e.g., is orthogonal to, the X direction are formed by coating a resist and by patterning by exposing.

Figures 7A, 7B, 7C:
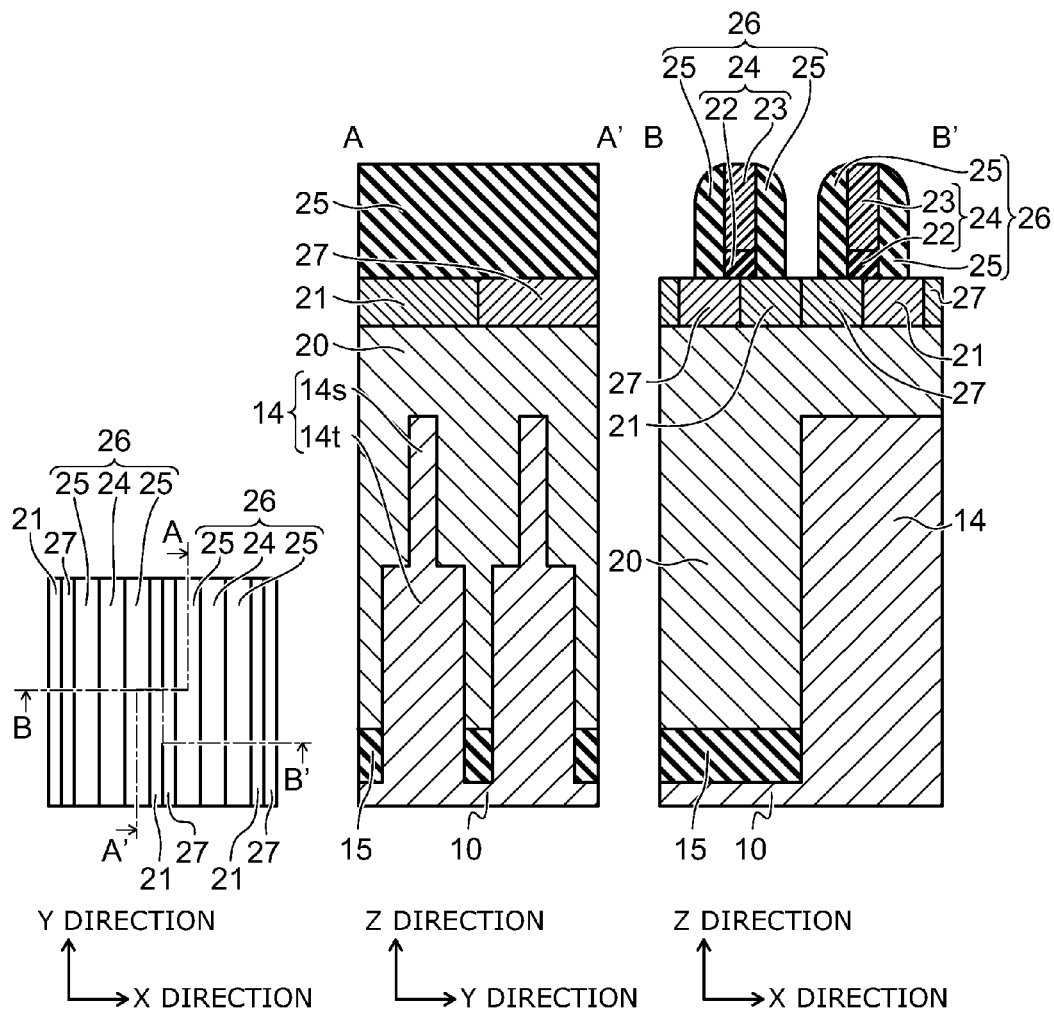

Continuing as shown in FIGS. 7A to 7C, the pattern of the resist patterns 23 is transferred onto the anti-reflection coating 22 while making the widths of the resist patterns 23 finer by performing RIE. Thereby, core members 24 made of the anti-reflection coating 22 and the resist patterns 23 are formed to extend in the Y direction. Then, sidewall hard masks 25 are formed on the two side surfaces of the core member 24 by forming, for example, a silicon oxide film on the entire surface and by performing etch-back of the entire surface. The sidewall hard masks 25 are formed of, for example, silicon oxide as described above because it is necessary to form the sidewall hard masks 25 at a low temperature such that the resist patterns 23 are not damaged.

Then, ion implantation of boron is performed from an obliquely upward direction that is tilted from the upward perpendicular direction toward one X-direction side using a structural body 26 made of each of the core members 24 and the pair of the sidewall hard masks 25 formed on the two side surfaces of each of the core members 24 as a mask. Thereby, the boron is implanted in the region directly under the structural body 26 on the boron projection-direction side of the structural body 26. As a result, the portion of the non-doped silicon film 21 including the region directly under one of the pair of the sidewall hard masks 25 included in the structural body 26 becomes a boron-doped silicon film 27; and the portion of the non-doped silicon film 21 including the region directly under the other one of the pair of the sidewall hard masks 25 remains as-is as the non-doped silicon film 21. In other words, the region directly under every other sidewall hard mask 25 of the multiple sidewall hard masks 25 arranged in the X direction becomes the non-doped silicon film 21; and the region directly under every other sidewall hard mask 25 between the non-doped silicon film 21 becomes the boron-doped silicon film 27.

Figures 8A, 8B, 8C:
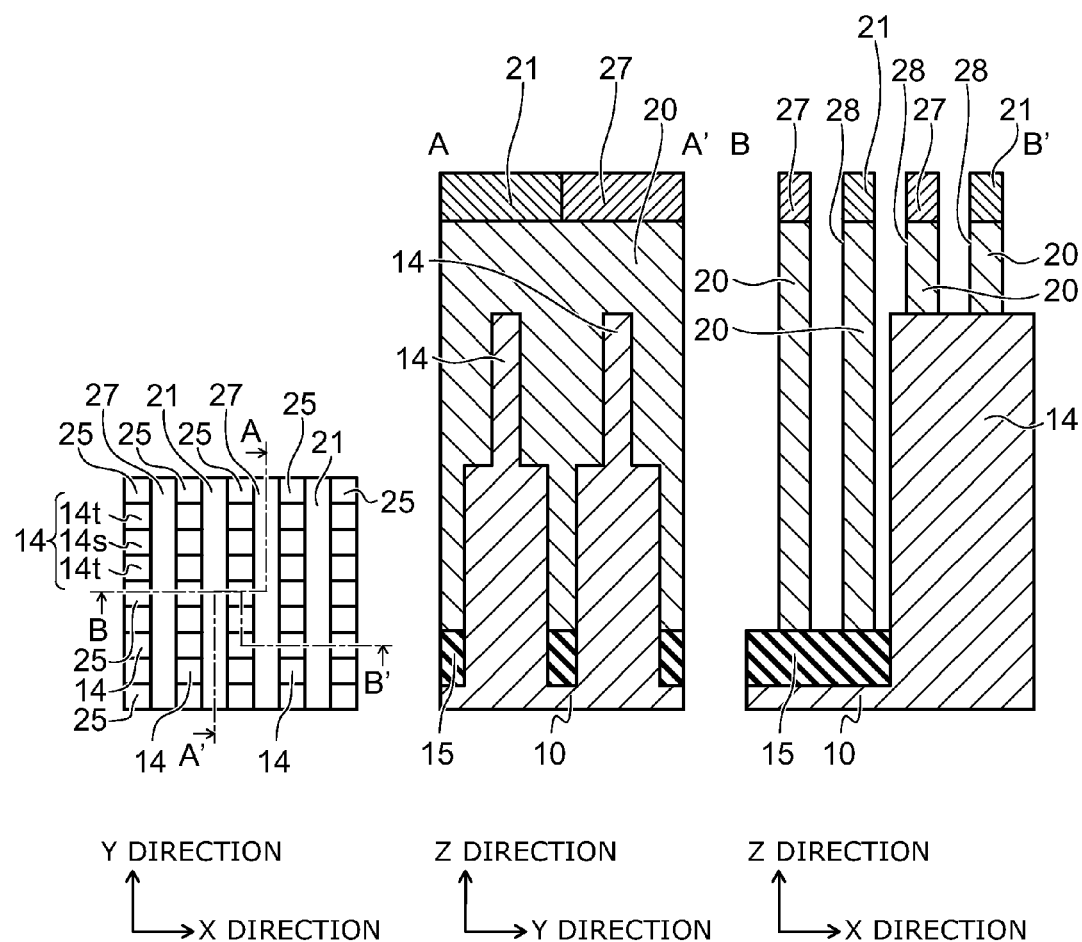

Continuing as shown in FIGS. 8A to 8C, the resist patterns 23 and the anti-reflection coating 22 (referring to FIGS. 7A to 7C) are removed by ashing. Then, the non-doped silicon film 21, the boron-doped silicon film 27, and the carbon film 20 are selectively removed by performing anisotropic etching such as RIE, etc., using the sidewall hard masks 25 (referring to FIGS. 7A to 7C) as a mask. Thereby, a stacked body made of the carbon film 20 and the non-doped silicon film 21 and a stacked body made of the carbon film 20 and the boron-doped silicon film 27 are formed in the regions directly under the sidewall hard masks 25. The stacked bodies are alternately arranged; and the spaces between the stacked bodies are trenches 28 extending in the Y direction. At this time, there are cases where the sidewall hard masks 25 vanish in the patterning of the carbon film 20; and there are cases where a portion of the sidewall hard masks 25 remains. In the case where the sidewall hard masks 25 remain, the sidewall hard masks 25 are removed by wet processing.

Figures 9A, 9B, 9C:
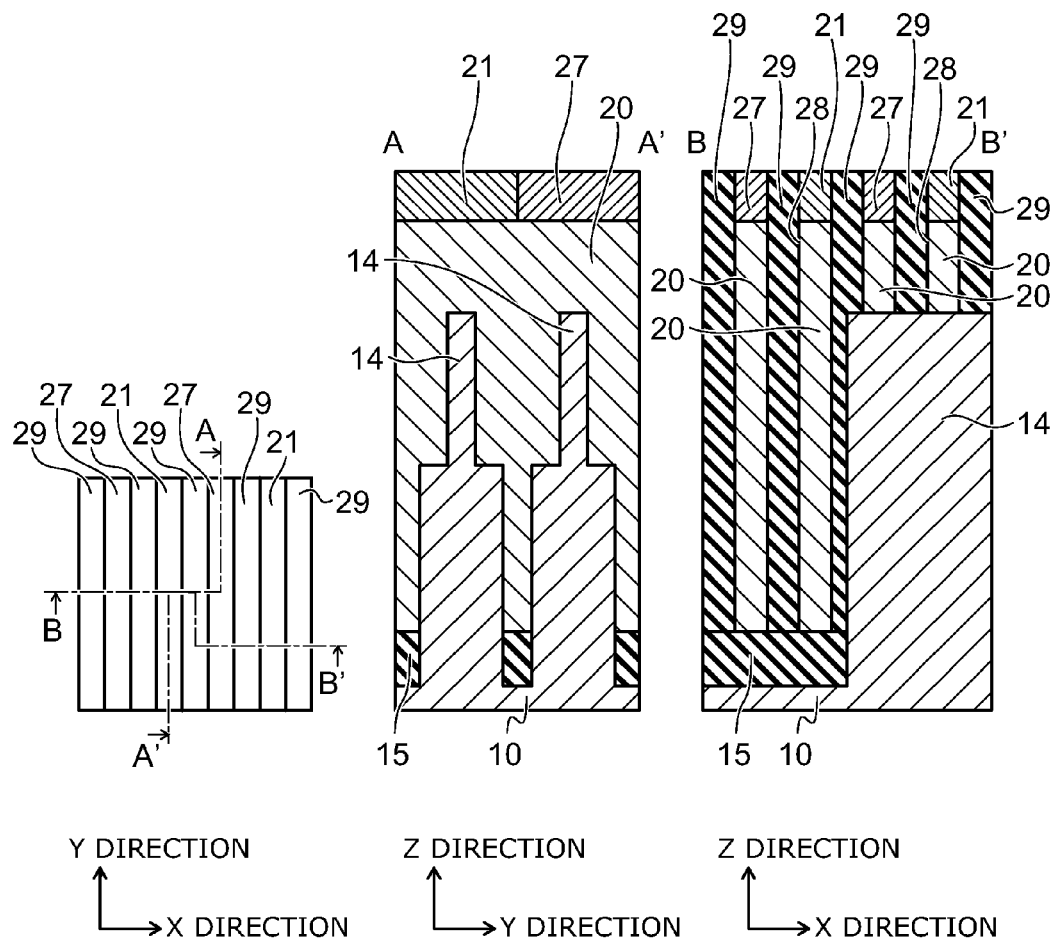

Then, as shown in FIGS. 9A to 9C, sidewall members 29 are filled into the trenches 28 by depositing an insulating material, e.g., silicon nitride, on the entire surface. At this time, the sidewall members 29 can be formed by a relatively low-temperature process that does not affect the carbon film 20 by forming the sidewall members 29 of silicon nitride. Then, the upper surface of the non-doped silicon film 21 and the upper surface of the boron-doped silicon film 27 are exposed by causing the upper surfaces of the sidewall members 29 to recede by performing etch-back of the entire surface.

Figures 10A, 10B, 10C:
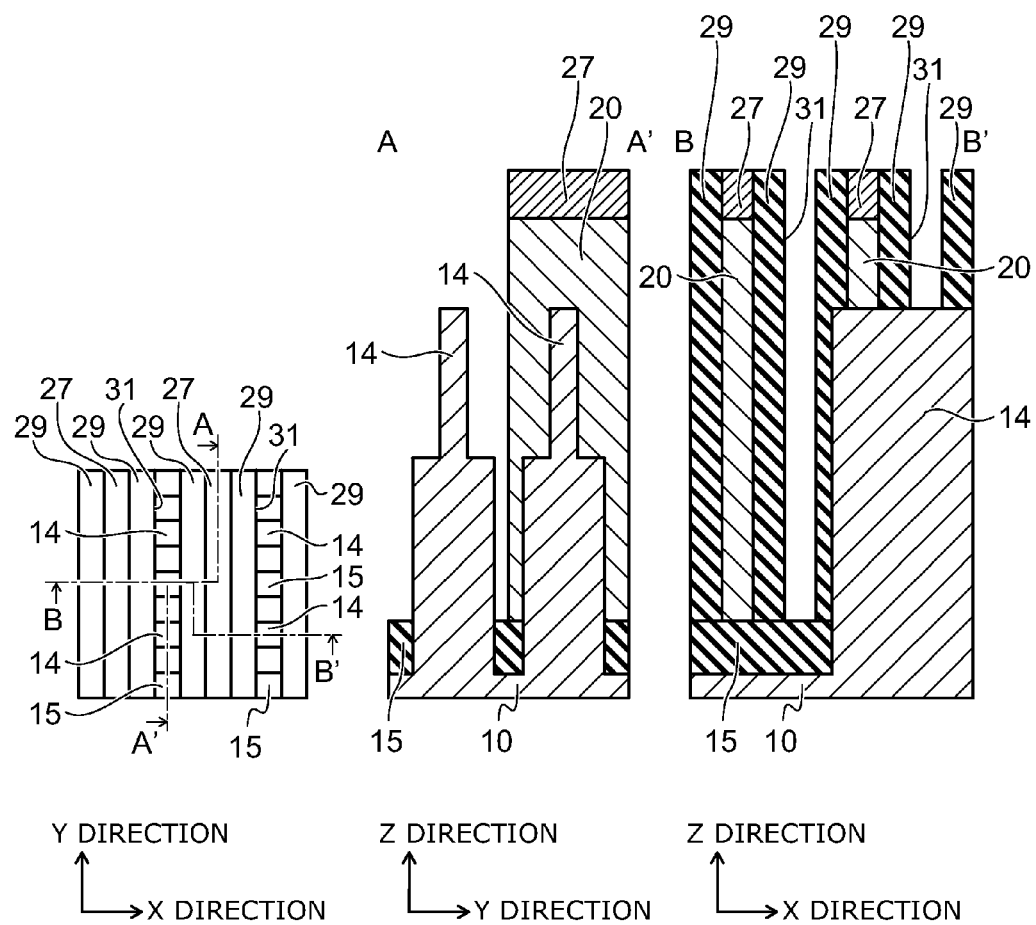

Continuing as shown in FIGS. 10A to 10C, an alkali treatment is performed using, for example, TMY (a choline aqueous solution). Thereby, although the boron-doped silicon film 27 substantially is not dissolved, the non-doped silicon film 21 is dissolved and removed; and the carbon film 20 is exposed. Then, the exposed portion of the carbon film 20, i.e., the portion positioned in the region directly under the non-doped silicon film 21, is removed by ashing. Thereby, a trench 31 is made to extend in the Y direction in every other space between the sidewall members 29. A portion of the fin 14 in the longitudinal direction in the interior of the trench 31 is exposed. On the other hand, the trench 31 is not made in the space between the sidewall members 29 that is positioned in the region directly under the boron-doped silicon film 27 because the boron-doped silicon film 27 is not removed and therefore the carbon film 20 is not removed. The trench 31 is the space into which the gate electrode is to be filled in a subsequent process.

Figures 11A, 11B, 11C:
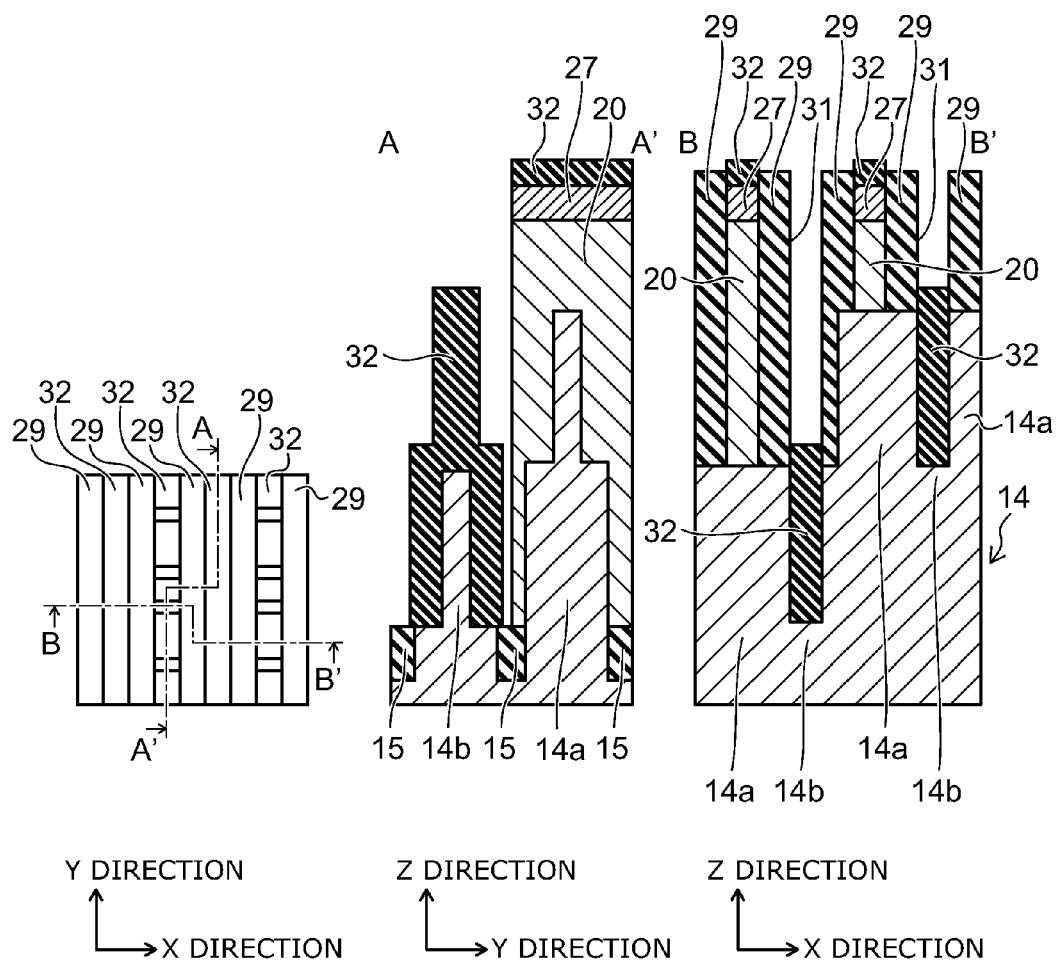

Then, as shown in FIGS. 11A to 11C, an oxidation treatment is performed. Thereby, the portion of the fin 14 exposed inside the trench 31 is oxidized from the surface to become a silicon oxide film 32. The thickness of the silicon oxide film 32 is thicker than the thickness of the silicon layer prior to the oxidizing. At this time, the entire upper portion 14s of the portion of the fin 14 positioned inside the trench 31 which is relatively fine is oxidized to become the silicon oxide film 32. On the other hand, although the two side portions and the upper end portion of the lower portion 14t which is relatively thick are oxidized to become the silicon oxide film 32, the portion of the width-direction central portion excluding the upper end portion of the width-direction central portion remains as-is as silicon.

Hereinbelow, the portion of the fin 14 positioned inside the trench 31 and remaining as-is as silicon is called an unoxidized portion 14b. The unoxidized portion 14b corresponds to the width-direction central portion of the lower portion of the fin 14 prior to the oxidation treatment; and the cross section of the unoxidized portion 14b perpendicular to the X direction has an I-shaped configuration. On the other hand, the portion of the fin 14 covered with the carbon film 20 and the sidewall members 29 remains without being oxidized. Such a portion is called a remaining portion 14a for convenience. At this stage, the remaining portion 14a and the unoxidized portion 14b of the fin 14 are alternately and integrally arranged along the X direction. Also, at this time, the upper layer portion of the boron-doped silicon film 27 is oxidized to become the silicon oxide film 32.

Figures 12A, 12B, 12C:
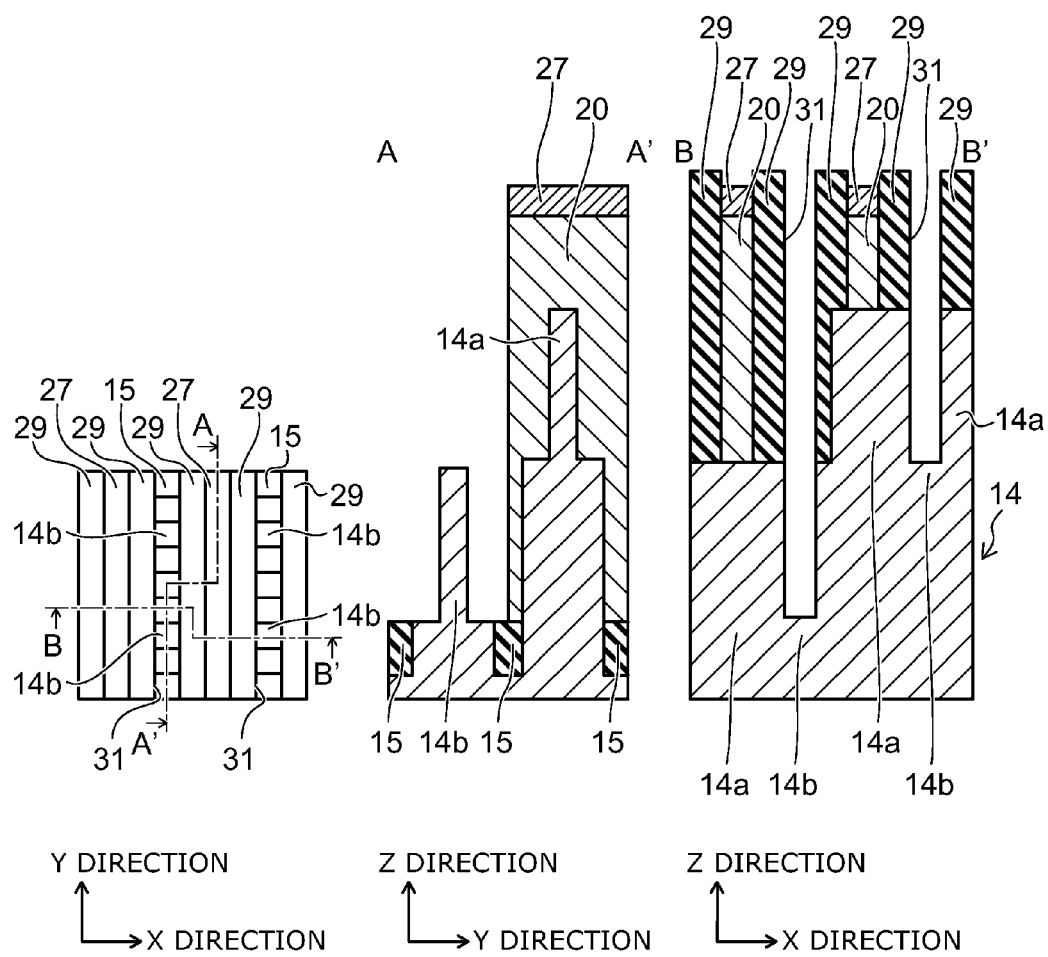

Then, as shown in FIGS. 12A to 12C, the silicon oxide film 32 (referring to FIGS. 11A to 11C) is removed by performing, for example, wet processing. Thereby, the unoxidized portion 14b of the fin 14 inside the trench 31 is exposed. The height of the unoxidized portion 14b is determined by the etching amount of the process shown in FIGS. 2A and 2B and the oxidation amount of the process shown in FIGS. 11A to 11C.

Isotropic etching of the fin 14 may be performed instead of the oxidation process shown in FIGS. 11A to 11C and the wet processing process shown in FIGS. 12A to 12C. Thereby, the portion corresponding to the unoxidized portion 14b can be formed from the fin 14. In such a case, the height of the portion corresponding to the unoxidized portion 14b is determined by the isotropic etching amount and the etching amount of the process shown in FIGS. 2A and 2B.

Figures 13A, 13B, 13C:
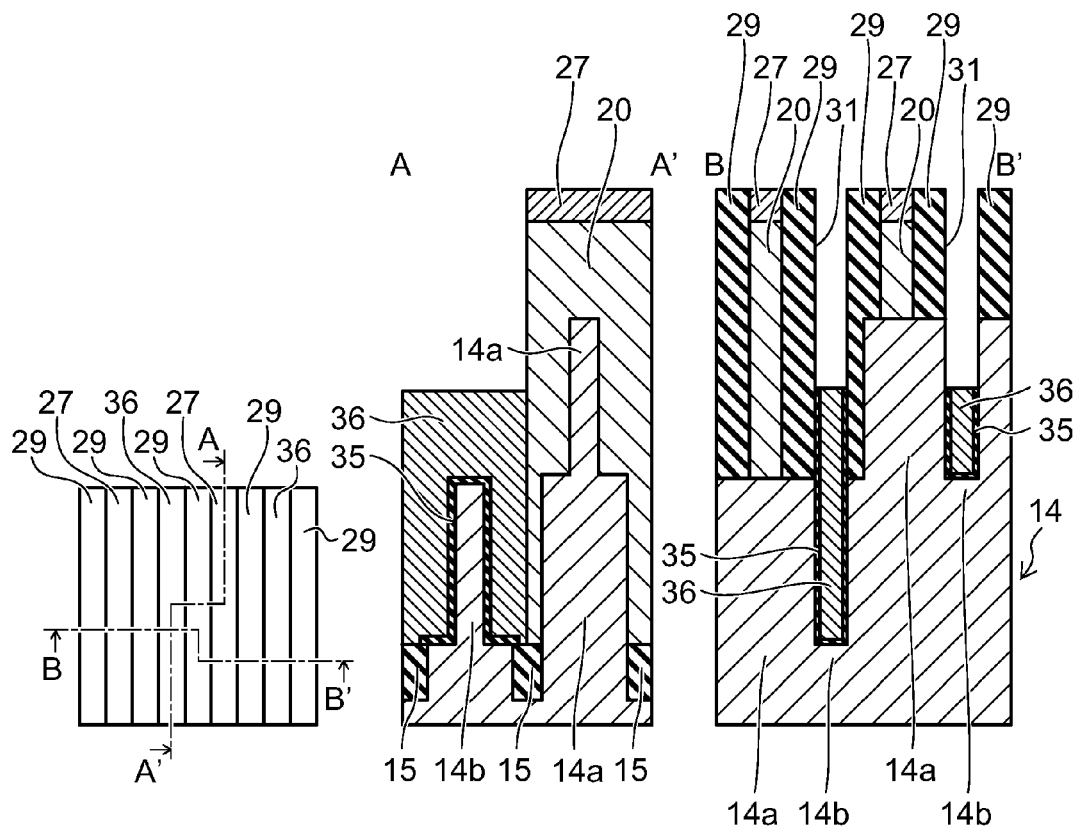

Then, as shown in FIGS. 13A to 13C, a gate insulating film 35 is formed on the surface of the fin 14 by performing, for example, a thermal oxidation treatment. Continuing, for example, titanium nitride is deposited; and a gate electrode 36 is made of a metal filled into the trench 31 by depositing tungsten. Then, the gate electrode 36 is recessed by performing etch-back of the entire surface; and the upper surface of the gate electrode 36 is caused to recede to the desired height.

Figures 14A, 14B, 14C:
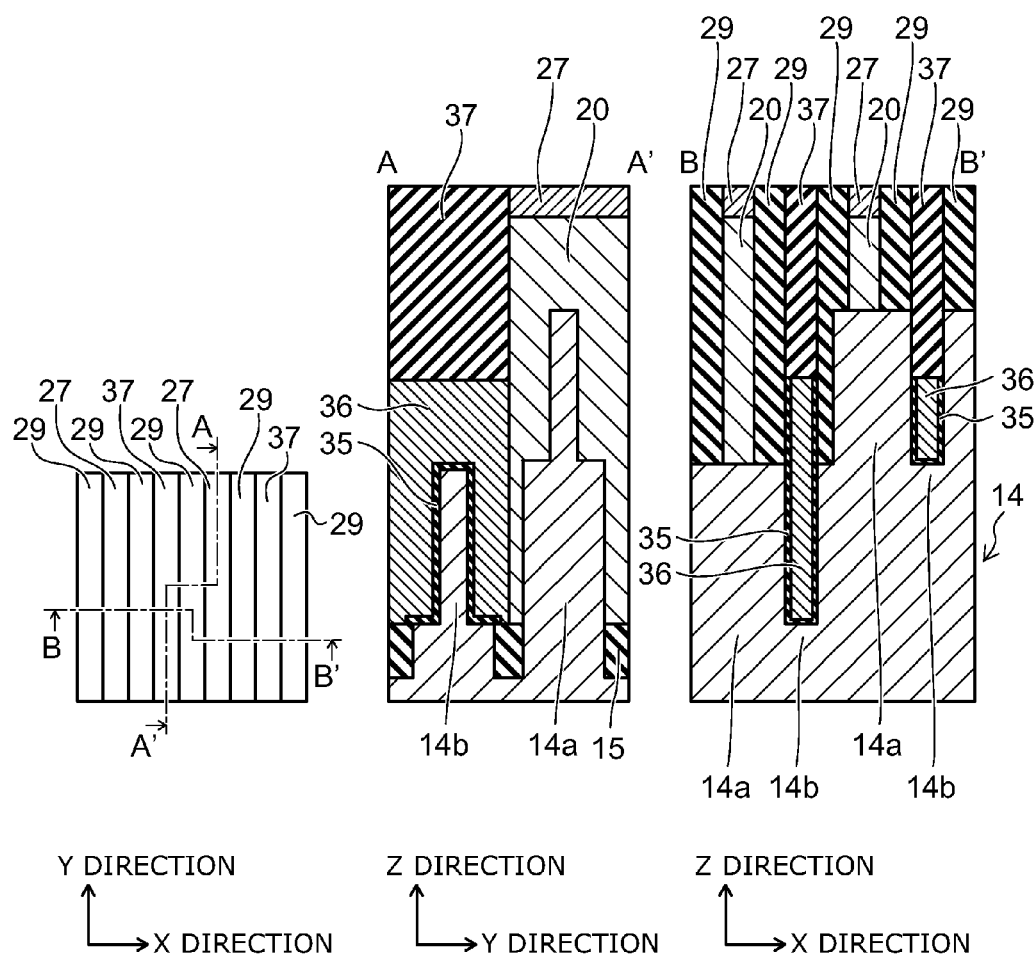

Continuing as shown in FIGS. 14A to 14C, an on-gate insulating film 37 is filled into the portion on the gate electrode 36 inside the trench 31 by depositing an insulating material, e.g., silicon nitride. Then, the upper surface of the boron-doped silicon film 27 and the upper surfaces of the sidewall members 29 are exposed by performing etch-back of the entire surface.

Figures 15A, 15B, 15C:
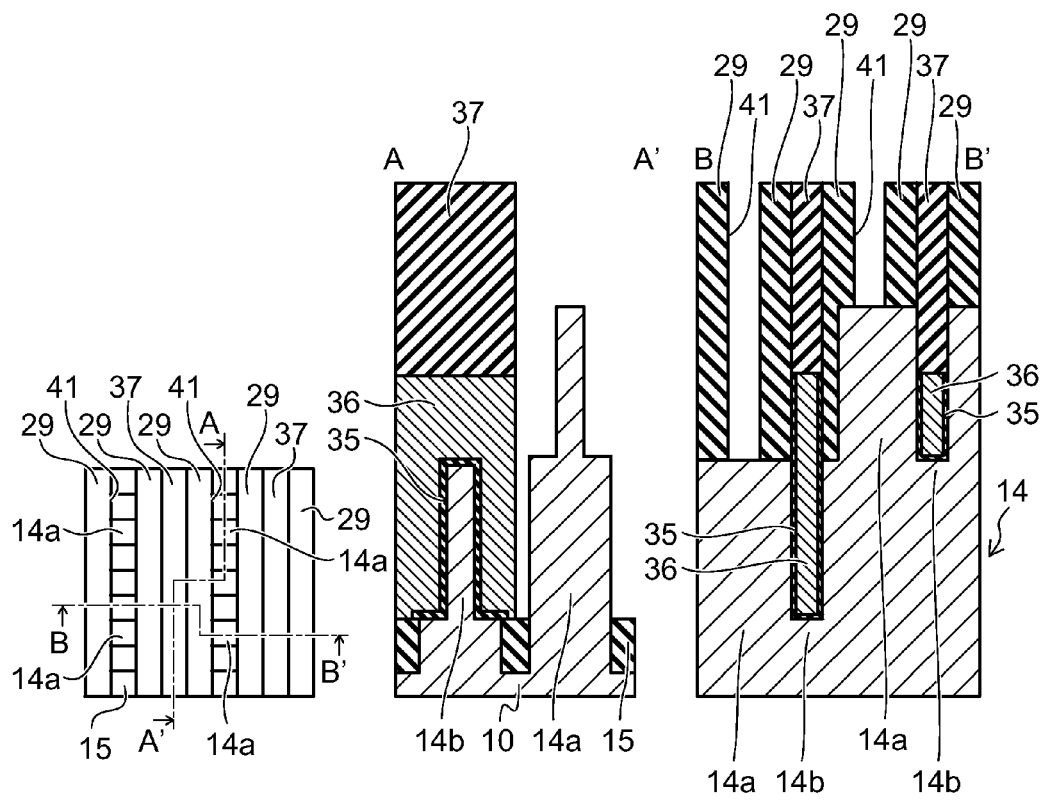

Then, as shown in FIGS. 15A to 15C, the boron-doped silicon film 27 (referring to FIGS. 14A to 14C) is removed by performing anisotropic etching such as RIE, etc. Thereby, the carbon film 20 (referring to FIGS. 14A to 14C) that was disposed in the region directly under the boron-doped silicon film 27 is exposed. Continuing, the exposed portion of the carbon film 20, i.e., the portion positioned in the region directly under the boron-doped silicon film 27, is removed by ashing. Thereby, a trench 41 is made in the space between the sidewall members 29 where the trench 31 is not made. The portion of the remaining portion 14a of the fin 14 inside the trench 41 that was protected by the boron-doped silicon film 27 and the carbon film 20 is exposed. Then, a diffusion region (not shown) is formed by ion implantation of an impurity into the remaining portion 14a.

Figures 16A, 16B, 16C:
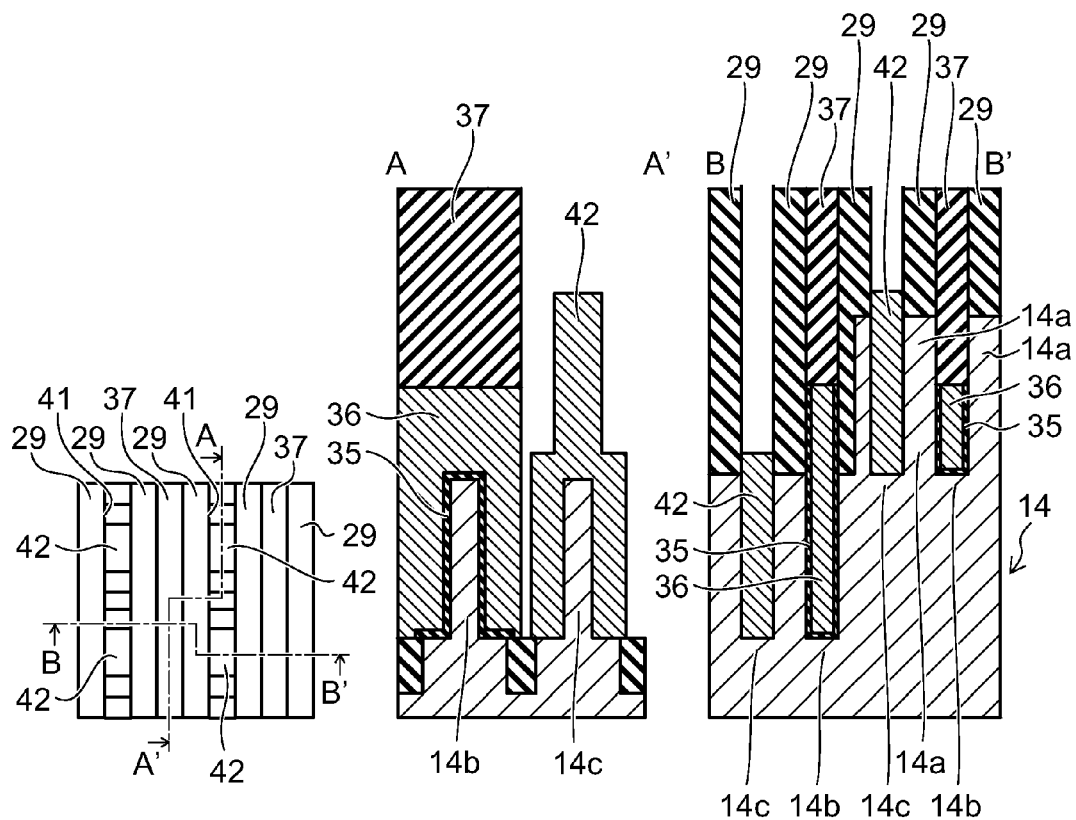

Continuing as shown in FIGS. 16A to 16C, the surface of the fin 14 is silicided by, for example, depositing nickel, causing the nickel to react with the exposed portion of the silicon by annealing, and by subsequently removing the unreacted nickel. Thereby, a silicide layer 42 is formed. At this time, when the exposed portion of the remaining portion 14a of the fin 14 is silicided, either the entire upper portion 14s which is relatively fine is silicided to become the silicide layer 42; or the central portion of the upper portion 14s is left as-is as silicon and the outer circumferential portion of the upper portion 14s is silicided to become the silicide layer 42. FIGS. 16B and 16C show the case where the entire upper portion 14s of the remaining portion 14a has become the silicide layer 42. On the other hand, although the two side portions and the upper end portion of the lower portion 14t which is relatively thick are silicided to become the silicide layer 42, the portion of the width-direction central portion excluding the upper end portion of the width-direction central portion remains as-is as the silicon. Hereinbelow, the silicon portion thus surrounded with the silicide layer 42 is called an unreacted portion 14c. The unreacted portion 14c was a portion of the remaining portion 14a prior to being silicided. The volume of the silicide layer 42 is greater than that of the silicon prior to the reaction. Thus, at a portion of the remaining portion 14a of the fin 14 that is separated from the unoxidized portion 14b in the X direction, the upper portion 14s and the two side portions of the lower portion 14t are caused to become conductors, that is, are silicided.

Hereinbelow, the remaining portion 14a, the unoxidized portion 14b, and the unreacted portion 14c are generally referred to as the fin 44. The fin 44 is formed by locally patterning the fin 14. The unoxidized portion 14b of the fin 44 which is covered with the gate insulating film 35 and the gate electrode 36 is alternately arranged with the unreacted portion 14c of the fin 44 which is covered with the silicide layer 42; and the remaining portion 14a of the fin 44 which is covered with the sidewall member 29 is disposed between the unoxidized portion 14b and the unreacted portion 14c. The remaining portion 14a, the unoxidized portion 14b, and the unreacted portion 14c are linked integrally.

Figures 17A, 17B, 17C:
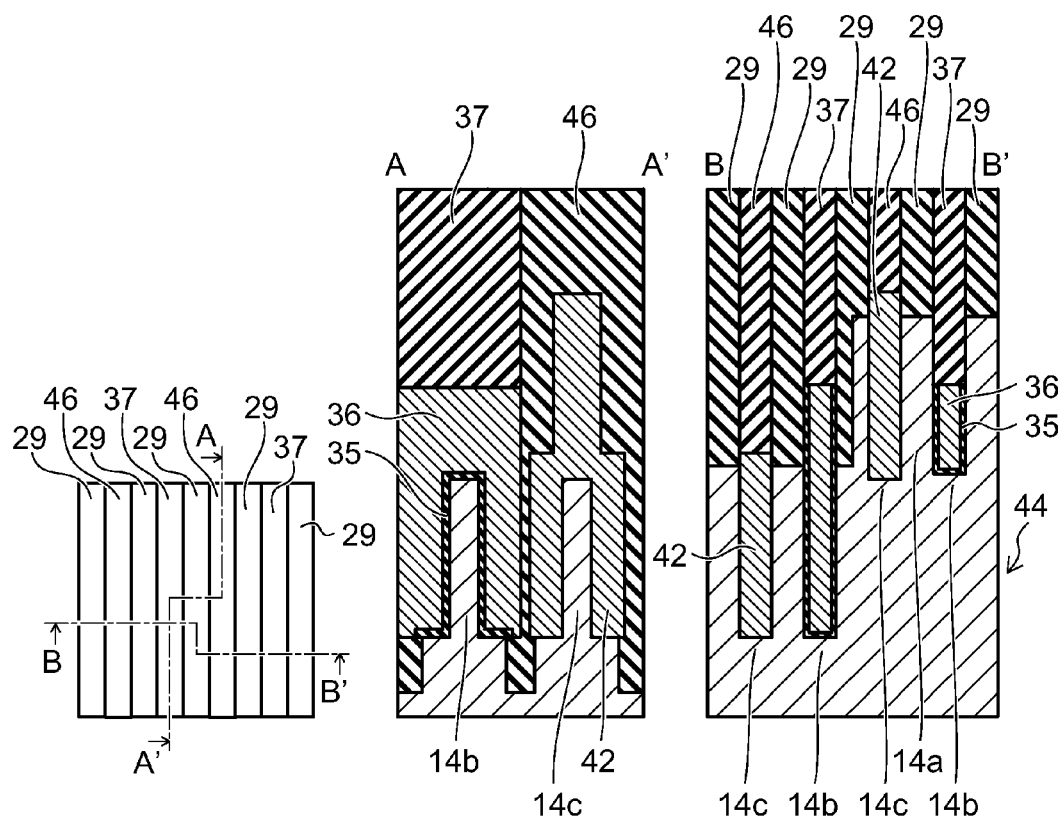

Then, as shown in FIGS. 17A to 17C, an inter-layer insulating film 46 made of, for example, silicon oxide is formed on the entirety. Then, the on-gate insulating film 37 and the sidewall members 29 are exposed by performing etch-back or CMP on the entire surface.

Figures 18A, 18B, 18C:
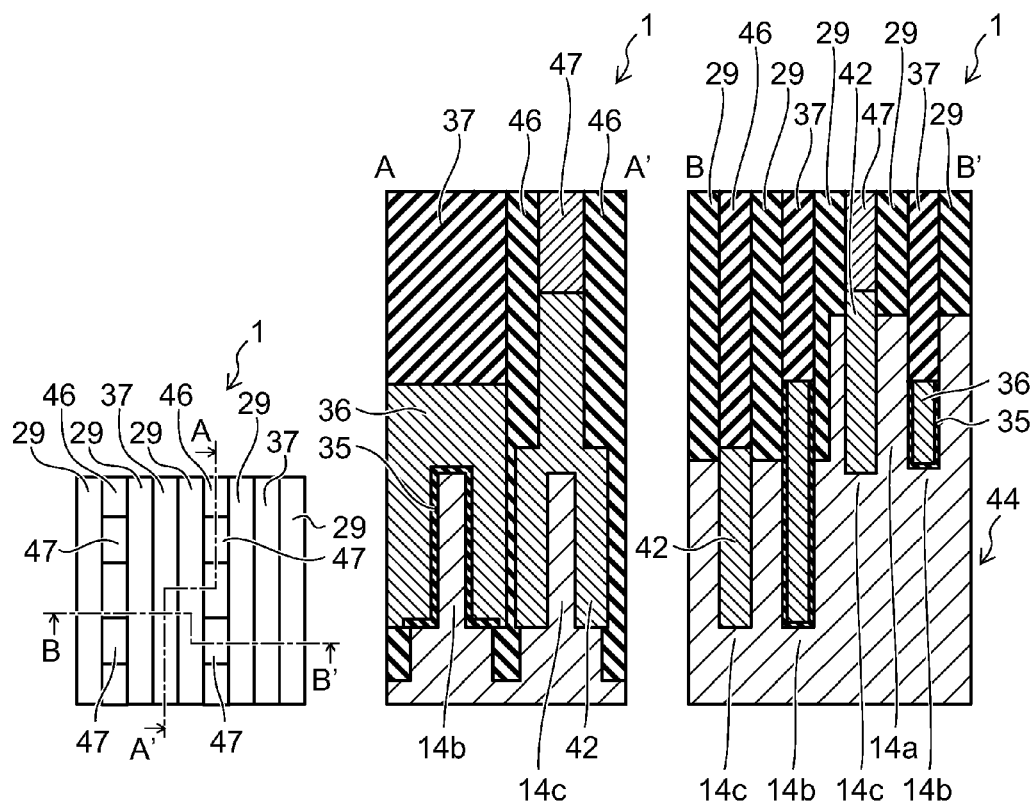

Continuing as shown in FIGS. 18A to 18C, a contact hole is made in the portion of the inter-layer insulating film 46 corresponding to the region directly above the unreacted portion 14c; and a metal material is filled into the interior of the contact hole. Thereby, a contact 47 is filled into the inter-layer insulating film 46 and is connected to the silicide layer 42. Thereby, the semiconductor device 1 according to the embodiment is manufactured.

The configuration of the semiconductor device 1 thus manufactured will now be described.

FIGS. 19A to 19E show the semiconductor device according to the embodiment. FIG. 19A is a plan view; FIG. 19B is a cross-sectional view along line C-C' of FIG. 19A; FIG. 19C is a cross-sectional view along line D-D' of FIG. 19A; FIG. 19D is a cross-sectional view along line E-E' of FIG. 19A; and FIG. 19E is a cross-sectional view along line F-F' of FIG. 19A.

For convenience of illustration in FIG. 19A, only conductive portions are shown; and insulating portions are not shown.

In the semiconductor device 1 according to the embodiment as shown in FIGS. 19A to 19E, the multiple fins 44 are formed in the upper surface of the silicon substrate 10 to extend in the X direction. The multiple gate electrodes 36 are provided above the fins 44 to extend in the Y direction. The gate electrodes 36 are metal electrodes made of, for example, a metal material; and, for example, a tungsten film is stacked on a titanium nitride layer. The unoxidized portion 14b and the unreacted portion 14c of the fin 44 are alternately arranged; and the remaining portion 14a of the fin 44 is disposed between the unoxidized portion 14b and the unreacted portion 14c.

The upper end of the unoxidized portion 14b is positioned lower than the upper ends of the remaining portions 14a on the two sides of the unoxidized portion 14b; and the gate electrode 36 is disposed to straddle the unoxidized portion 14b. The gate insulating film 35 is provided between the fin 44 and the gate electrode 36. Thereby, a fin transistor 50 is formed at the most proximal portions between each of the fins 44 and each of the gate electrodes 36. The portion of the unoxidized portion 14b of the fin 44 opposing the gate electrode 36 with the gate insulating film 35 interposed functions as the channel region of the fin transistor 50.

The upper end of the unreacted portion 14c also is positioned lower than the upper ends of the remaining portions 14a on the two sides of the unreacted portion 14c; and the upper surface and the two side surfaces of the unreacted portion 14c are covered with the silicide layer 42 as a conductive layer. The silicide layer 42 protrudes upward to be large in a region including the region directly above the unreacted portion 14c. In other words, the silicide layer 42 includes a base portion 42a disposed on the unreacted portion 14c side surface, and a protruding portion 42b disposed in the region directly above the unreacted portion 14c to protrude upward from the base portion 42a. In the YZ plane, the width of the protruding portion 42b is finer than the width of the base portion 42a. Accordingly, the cross section (the YZ cross section) of the configuration of the bonded body of the unreacted portion 14c and the silicide layer 42 perpendicular to the longitudinal direction (the X direction) of the fin 44 is an inverted T-shape protruding upward. The silicide layer 42 functions as a bypass that reduces the on-resistance of the fin transistor 50.

The upper end of the remaining portion 14a is positioned higher than the upper end of the unoxidized portion 14b and the upper end of the unreacted portion 14c which are on the two sides of the remaining portion 14a; and the configuration of the YZ cross section of the remaining portion 14a is an inverted T-shape protruding upward. The remaining portion 14a functions as a diffusion region (a source/drain region) of the fin transistor 50.

The on-gate insulating film 37 made of, for example, silicon nitride is provided on the gate electrode 36. The inter-layer insulating film 46 made of, for example, silicon oxide is provided on the silicide layer 42. The contact 47 is filled into the inter-layer insulating film 46 and is connected to the upper surface of the silicide layer 42. The sidewall members 29 made of, for example, silicon nitride is provided above the remaining portion 14a of the fin 44.

Effects of the embodiment will now be described.

First, effects of the device will be described.

In the semiconductor device 1 according to the embodiment, the fin 44 is formed in the upper surface of the silicon substrate 10; and the gate electrode 36 is disposed to straddle the fin 44. Thereby, the channel width of the fin transistor 50 increases because the length of the region of the YZ cross section where the fin 44 opposes the gate electrode 36 is longer. As a result, the current flowing in each of the fin transistors 50 increases.

The upper end of the remaining portion 14a of the fin 44 which is used as the diffusion region is positioned higher than the upper end of the unoxidized portion 14b of the fin 44 which is used as the channel region; and the silicide layer 42 is provided to cover the unreacted portion 14c of the fin 44 which is disposed between the unoxidized portions 14b. Because the silicide layer 42 is used as the current path, the on-resistance of the fin transistor 50 can be reduced; and the current can be increased even more.

The protruding portion 42b is provided in the silicide layer 42 to protrude upward to be large in the region directly above the unreacted portion 14c. Thereby, the cross-sectional area of the silicide layer 42 can be increased without increasing the chip surface area; and the current flowing in the fin transistor 50 can be increased even more.

Thus, in the semiconductor device 1 according to the embodiment, the fin transistor 50 having a large amount of current per chip surface area can be formed. Such a fin transistor 50 can be used as, for example, the control transistor of an element for which the integration is high and a large current is necessary; and such a fin transistor 50 can be used favorably as, for example, the control transistor of a current-controlled memory element. The semiconductor device 1 is, for example, an MRAM (Magneto resistive Random Access Memory).

Effects of the processes will now be described.

In the embodiment, the fins 12 are formed by performing etching using the hard masks 11 as a mask in the process shown in FIGS. 1A and 1B; and the fins 14 for which the cross-sectional configurations are inverted T-shaped configurations are formed by again performing etching using the hard masks 11 and the sidewall hard masks 13 as a mask in the process shown in FIGS. 2A and 2B. Then, the portion of the fin 14 to be covered with the gate electrode 36 is exposed in the process shown in FIGS. 10A to 10C; the surface layer portion of the fin 14 is oxidized to form the silicon oxide film 32 and the width-direction central portion of the fin 14 is left as the unoxidized portion 14b by performing the oxidation treatment in the process shown in FIGS. 11A to 11C; and the silicon oxide film 32 is removed by performing the wet processing in the process shown in FIGS. 12A to 12C.

Thereby, the unoxidized portion 14b having the I-shape can be formed self-aligningly from the fin 14 having the inverted T-shape. In such a case, the recess amount of the fin 14, i.e., the difference of the height between the upper end of the remaining portion 14a which is used as the diffusion region and the upper end of the unoxidized portion 14b which is used as the channel region, is determined by the etching amount of the process shown in FIGS. 1A and 1B. Because the etching is performed by etching of the plane, the etching amount can be controlled with high precision. Accordingly, the recess amount of the fin 14 can be controlled to be uniform. Thereby, for example, the size of the resistance of the diffusion region can be uniform.

Because the etching amount of the process shown in FIGS. 2A and 2B corresponds to the total amount of the element separation depth between the fins 44 and the height of the unoxidized portion 14b or the unreacted portion 14c, the channel width of the fin transistor 50 is determined by the etching amount. Because the etching is performed by etching of the plane, the etching amount can be controlled with high precision. Similar effects are obtained even in the case where isotropic etching is performed instead of the oxidation treatment and the wet processing.

Similarly, in the embodiment, after forming the fin 14 for which the cross-sectional configuration is an inverted T-shaped configuration, the surface layer portion of the fin 14 is silicided to form the silicide layer 42 and the width-direction central portion of the fin 14 is left as the unreacted portion 14c by performing the siliciding in the process shown in FIGS. 16A to 16C. Thereby, the unreacted portion 14c having the I-shape and the silicide layer 42 covering the unreacted portion 14c can be formed self-aligningly from the fin 14 having the inverted T-shape. In such a case, as described above, the height of the protruding portion of the silicide layer 42 can be uniform because the recess depth of the fin 14 can be determined by the etching amount of the process shown in FIGS. 1A and 1B. As a result, the size of the resistance from the contact 47 to the channel region (the unoxidized portion 14b) can be controlled with high precision.

Thus, in the embodiment, the characteristics of the fin transistor 50 can be controlled by determining the configuration of each portion by the etching amount of the process shown in FIGS. 1A and 1B and the etching amount of the process shown in FIGS. 2A and 2B. As described above, the etching amount can be controlled with high precision because the etching is performed by etching of the plane. Therefore, according to the embodiment, a semiconductor device including a fin transistor having a large amount of current per chip surface area can be manufactured easily and stably.

Conversely, it also may be considered to initially form a fin having an I-shape and recess one portion of the fin by selectively etching the fin. However, in such a case, it is problematic in that the recess amount is undesirably dependent on the configuration of the fin with extreme sensitivity. For example, in the case where the fin is slightly finer than the design value, there are cases where rounding of the fin occurs when the etching is performed and the recess amount undesirably becomes exceedingly large. Therefore, for the semiconductor device manufactured by such a method, the stability of the configuration of the fin transistor is low; and accordingly, the stability of the characteristics also is low.

In the embodiment, the silicide layer 42 is formed by performing the siliciding of the fin 14 having the inverted T-shaped configuration in the process shown in FIGS. 16A to 16C. Thereby, it is unnecessary to supply silicon for the siliciding after forming the fin 14 because the silicon used as the material of the silicide layer 42 is supplied from the fin 14. As a result, the number of processes can be reduced.

Conversely, if siliciding is performed on a fin having a fine I-shape, it is necessary to additionally supply the silicon to form a silicide layer having a sufficient film thickness by, for example, means such as epitaxial growth of a silicon layer on the side surface of the fin, etc. Therefore, the number of processes undesirably increases.

In the embodiment, the gate electrode 36 is formed by forming the multiple sidewall members 29 extending in the Y direction in the process shown in FIGS. 9A to 9C, by making the trench 31 in every other space between the sidewall members 29 in the process shown in FIGS. 10A to 10C, and by filling a metal material into the trench 31 in the process shown in FIGS. 13A to 13C. The silicide layer 42 is formed by making the trench 41 in the remaining space between the sidewall members 29 in the process shown in FIGS. 15A to 15C and by filling a transition metal such as nickel, etc., into the trench 41 and causing the transition metal to react in the process shown in FIGS. 16A to 16C. Thus, by forming the sidewall members 29 first, the gate electrode 36 and the silicide layer 42 can be formed easily by combining normal processes.

Conversely, it also may be considered to firstly form a protective sidewall to cover the entire fin, subsequently expose the fin selectively by removing the protective sidewall from the region where the gate electrode and the silicide layer are to be formed, and perform an oxidation treatment and siliciding of the portion that is exposed. However, in such a case, if the aspect ratio of the fin is high, it becomes exceedingly difficult to remove the protective sidewall from the side surface of the fin.

In the embodiment, ion implantation of boron is performed from a direction that is oblique to the non-doped silicon film 21 using the structural body 26 as a mask in the process shown in FIGS. 7A to 7C. Thereby, the non-doped silicon film 21 and the boron-doped silicon film 27 are individually made in the regions directly under the pair of the sidewall hard masks 25 included in each of the structural bodies 26. Then, the non-doped silicon film 21 is removed while leaving the boron-doped silicon film 27 by performing the alkali treatment in the process shown in FIGS. 10A to 10C. Thereby, the gate electrode 36 can be formed by making the trench 31 in every other space between the sidewall members 29. The silicide layer 42 can be formed by making the trench 41 in every other remaining space between the sidewall members 29 by removing the non-doped silicon film 21 by performing RIE in the process shown in FIGS. 15A to 15C.

Thereby, it is possible to individually make the gate electrode 36 and the silicide layer 42 after arranging the sidewall hard masks 25 with a short period by the sidewall process in the process shown in FIGS. 7A to 7C, making the trenches 28 by transferring the sidewall hard masks 25 onto the carbon film 20 in the process shown in FIGS. 8A to 8C, and filling the sidewall members 29 into the trenches 28 in the process shown in FIGS. 9A to 9C. Thus, the number of processes can be reduced because the gate electrode 36 and the silicide layer 42 can be formed partially by a common process. Also, the alignment can be performed self-aligningly in the processes after forming the resist patterns 23 in the process shown in FIGS. 6A to 6C. As a result, a semiconductor device having a configuration having high precision can be manufactured.

According to the embodiments described above, a semiconductor device and a method for manufacturing the semiconductor device including a transistor having a large amount of current per chip surface area can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
    forming a fin in an upper surface of a semiconductor substrate to extend in a first direction;
    forming a mask film to cover the fin;
    making a plurality of first trenches in the mask film to extend in a second direction intersecting the first direction to reach the fin;
    filling sidewall members into the first trenches, the sidewall members being insulative;
    making a second trench by removing the mask film from a portion of a space between the sidewall members;
    forming a gate insulating film on a surface of a first portion of the fin disposed inside the second trench;
    forming a gate electrode on the gate insulating film inside the second trench to extend in the second direction to straddle the first portion;
    making a third trench by removing the mask film from the remaining space between the sidewall members; and
    causing a second portion of the fin disposed inside the third trench to become a conductor.

2. The method according to claim 1, wherein
a cross section of a configuration of the fin has an inverted T-shaped configuration, and an upper portion of the fin is finer than a lower portion of the fin in the forming of the fin, and
the upper portion and two side portions of the lower portion are caused to become conductors in the causing of the second portion to become the conductor,
the method further comprising:
  causing the upper portion and the two side portions of the lower portion of the first portion to become oxide films by performing an oxidation treatment between the making of the second trench and the forming of the gate insulating film; and
  removing the oxide film between the making of the second trench and the forming of the gate insulating film.

3. The method according to claim 1, wherein
a cross section of a configuration of the fin has an inverted T-shaped configuration, and an upper portion of the fin is finer than a lower portion of the fin in the forming of the fin, and
the upper portion and two side portions of the lower portion are caused to become conductors in the causing of the second portion to become the conductor,
the method further comprising performing isotropic etching of the first portion between the making of the second trench and the forming of the gate insulating film.

4. The method according to claim 1, wherein
the making of the first trenches includes:
  forming a non-doped film on the mask film;
  forming a core member on the non-doped film to extend in the second direction;
  forming sidewall hard masks on two side surfaces of the core member;
  causing a portion of the non-doped film including a region directly under one of a pair of the sidewall hard masks formed on the two side surfaces of the core member to become an impurity-doped film by implanting an impurity into the non-doped film from a direction tilted toward one first-direction side with respect to an upward perpendicular direction using a structural body made of the core member and the pair of the sidewall hard masks as a mask;
  removing the core member; and
  selectively removing the mask film by performing anisotropic etching using the sidewall hard masks as a mask,
the making of the second trench includes:
  removing the non-doped film without removing the impurity-doped film; and
  removing a portion of the mask film positioned in a region directly under the non-doped film, and
the making of the third trench includes:
  removing the impurity-doped film; and
  removing a portion of the mask film positioned in a region directly under the impurity-doped film.

5. The method according to claim 4, wherein
the non-doped film is formed of non-doped silicon, and
the impurity is boron.

6. The method according to claim 5, wherein
the removing of the non-doped film includes an alkali treatment, and
the removing of the impurity-doped film includes performing anisotropic etching.

7. The method according to claim 1, wherein the mask film is formed of carbon.

8. The method according to claim 1, wherein
the semiconductor substrate includes silicon, and
the causing to become the conductor is performed by siliciding.

9. A method for manufacturing a semiconductor device, comprising:
  forming a fin in an upper surface of a semiconductor substrate to extend in a first direction, a cross section of the fin having an inverted T-shaped configuration, an upper portion of the fin being finer than a lower portion of the fin;
  removing the upper portion and two side portions of the lower portion of a first portion of the fin;
  forming a gate insulating film on a surface of the first portion;
  forming a gate electrode on the gate insulating film to extend in a second direction intersecting the first direction to straddle the first portion; and
  causing the upper portion and the two side portions of the lower portion of a second portion of the fin separated from the first portion in the first direction to become conductors.

10. The method according to claim 9, further comprising:
  forming a mask film to cover the fin;
  making a plurality of first trenches in the mask film to extend in the second direction to reach the fin;
  filling sidewall members into the first trenches, the sidewall members being insulative;
  making a second trench by removing the mask film from a portion of a space between the sidewall members; and
  making a third trench by removing the mask film from the remaining space between the sidewall members,
  the first portion being disposed inside the second trench,
  the removing, the forming of the gate insulating film, and the forming of the gate electrode being implemented between the making of the second trench and the making of the third trench,
  the second portion being disposed inside the third trench, and
  the causing to become the conductors being implemented after the making of the third trench.

11. The method according to claim 10, wherein the mask film is formed of carbon.

12. The method according to claim 9, wherein the removing includes:
  causing the upper portion and the two side portions of the lower portion of the first portion to become oxide films by performing an oxidation treatment; and
  removing the oxide film.

13. The method according to claim 9, wherein the removing includes performing isotropic etching of the first portion.

14. The method according to claim 9, wherein
the semiconductor substrate includes silicon, and
the causing to become the conductor is performed by siliciding.

15. A semiconductor device, comprising:
  a semiconductor substrate, a fin being formed in an upper surface of the semiconductor substrate to extend in a first direction;
  a gate electrode extending in a second direction intersecting the first direction to straddle a first portion of the fin;
  a gate insulating film disposed between the first portion and the gate electrode; and
  a conductive layer covering a second portion of the fin separated from the first portion in the first direction, the conductive layer including:
  a base portion disposed on a side surface of the second portion; and
  a protruding portion disposed in a region directly above the second portion to protrude upward from the base portion,
a width of the protruding portion being finer than a width of the base portion in a cross section perpendicular to the first direction,
an upper end of the first portion of the fin and an upper end of the second portion of the fin being positioned lower than an upper end of a portion of the fin excluding the first portion and the second portion.

16. The device according to claim 15, wherein
the semiconductor substrate includes silicon, and
the conductive layer is a silicide layer.

* * * * *